(12) United States Patent
Salmonson

(10) Patent No.: US 6,831,834 B1
(45) Date of Patent: Dec. 14, 2004

(54) ASSEMBLY PROCESS AND HEAT SINK DESIGN FOR HIGH POWERD PROCESSOR

(75) Inventor: Richard B. Salmonson, Chippewa Falls, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 450 days.

(21) Appl. No.: 09/619,869

(22) Filed: Jul. 20, 2000

(51) Int. Cl.$^7$ ............................................. H05K 7/20
(52) U.S. Cl. ....................... 361/704; 361/707; 361/713; 361/719; 257/718; 257/727; 174/16.3; 165/80.3
(58) Field of Search ................................ 361/688–690, 361/702–704, 707, 708, 709, 713, 719; 257/706, 717, 718, 727; 174/16.1, 16.3; 165/80.2, 80.3, 104.33, 185; 29/843, 842, 592.1; 439/259, 266, 342, 261

(56) References Cited

U.S. PATENT DOCUMENTS

| | | | | |
|---|---|---|---|---|
| 5,057,031 A | * | 10/1991 | Sinclair | 439/261 |
| 5,331,507 A | * | 7/1994 | Kyung et al. | 174/16.3 |
| 5,485,351 A | * | 1/1996 | Hopfer et al. | 361/704 |
| 5,643,000 A | * | 7/1997 | Dent | 439/69 |
| 5,697,803 A | * | 12/1997 | Kistner et al. | 439/342 |
| 5,847,928 A | * | 12/1998 | Hinshaw et al. | 361/704 |
| 5,880,930 A | * | 3/1999 | Wheaton | 361/690 |
| 6,014,315 A | * | 1/2000 | McCullough et al. | 361/704 |
| 6,021,045 A | * | 2/2000 | Johnson | 361/704 |
| 6,054,198 A | * | 4/2000 | Bunyan et al. | 428/40.5 |
| 6,071,128 A | * | 6/2000 | Brewington et al. | 439/73 |
| 6,186,812 B1 | * | 2/2001 | Ramsey et al. | 439/266 |
| 6,212,074 B1 | * | 4/2001 | Gonsalves et al. | 361/717 |
| 6,219,241 B1 | * | 4/2001 | Jones | 361/704 |
| 6,226,185 B1 | * | 5/2001 | Lin | 174/35 R |

* cited by examiner

Primary Examiner—Boris Chérvinsky
(74) Attorney, Agent, or Firm—Schwegman, Lundberg, Woessner & Kluth, P.A.

(57) ABSTRACT

The present invention includes one embodiment of a printed circuit board assembly including a printed circuit board, a microprocessor chip, a socket and an actuator for connecting the chip to the printed circuit board, a heat sink for attachment to the top surface of the chip, and a field installable thermal interface phase change pad positioned between the heat sink and the microprocessor chip. The heat sink has an actuator access opening so that the actuator is operable with the heat sink positioned on top of the microprocessor. The connection between the chip and the heat sink is free of alignment features so that they may be separated by twisting the heat sink relative to the chip. The connection between the heat sink and the circuit board is also free of alignment features.

One embodiment includes a method of disassembling and re-assembling a printed circuit board assembly including actuating an actuator of a socket attached to a printed circuit board with the socket securing a first chip to the printed circuit board and the first chip having a first thermal interface pad and a heat sink secured to the chip, removing the first chip and heat sink from the socket, separating the first chip from the heat sink, disposing the first chip and the first thermal interface pad, positioning a second chip on the socket, actuating the actuator to secure the second chip to the printed circuit board, positioning a second thermal interface pad on the top surface of the second chip, positioning the heat sink on the top surface of the second thermal interface pad, and securing the heat sink to the printed circuit board.

6 Claims, 2 Drawing Sheets

ASSEMBLY PROCESS AND HEAT SINK DESIGN FOR HIGH POWERD PROCESSOR

FIELD OF THE INVENTION

The present invention relates to the field of printed circuit boards. More particularly, this invention relates to an assembly process of a chip, such as a microprocessor chip, and heat sink to a circuit board.

BACKGROUND OF THE INVENTION

Some present assembly processes and heat sink designs may use thermal grease between the heat sink and the chip to improve thermal conductivity. Typically, thermal grease is applied between the chip and heat sink and the chip is attached to the circuit board. The thermal grease forms a thermal as well as mechanical bond between the chip and the heat sink which provides good heat transfer characteristics, but complicates replacement of the chip. Field replacement of the chip is difficult because thermal grease is difficult to work with and is not forgiving. The dispensing and application process must be precise for the interface to function properly. Therefore, field application of thermal grease is generally not feasible.

Therefore, in order to replace the chip, the chip and heat sink must be assembled in the factory and sent out as a unit to the field for installation. In order for the unit to be reliably installed in the field, coarse and fine alignment features are needed between the chip and the circuit board, between the chip and the heat sink and between the heat sink and the circuit board. These alignment features add cost and make it difficult to separate the chip from the heat sink for reuse of the heat sink.

What is needed is an assembly process and heat sink design that reduces the number of alignment features and allows for field replacement of the chip.

SUMMARY OF THE INVENTION

The present invention includes one embodiment of a printed circuit board assembly including a printed circuit board, a microprocessor chip, a socket and an actuator for connecting the chip to the printed circuit board, a heat sink for attachment to the top surface of the chip, and a thermal interface pad positioned between the heat sink and the microprocessor chip. The heat sink has an actuator access opening so that the actuator is operable with the heat sink positioned on top of the microprocessor. Optionally, the thermal interface pad is field installable. Optionally, the thermal interface pad includes a phase change material. Optionally, the connection between the chip and the heat sink is free of fine or all alignment features so that they may be separated by twisting the heat sink relative to the chip. Optionally, the connection between the heat sink and the circuit board is free of fine or all alignment features to reduce cost.

One embodiment includes a method of assembling a printed circuit board assembly including attaching a socket and actuator to the printed circuit board, positioning a microprocessor chip on the socket, actuating the actuator to secure the chip to the printed circuit board, positioning a thermal interface pad on the top surface of the chip, positioning a heat sink on the top surface of the thermal interface pad, and securing the heat sink to the printed circuit board.

Optionally, positioning the microprocessor chip on the socket is positioned without fine or all alignment features or positioned by hand.

One embodiment includes a method of disassembling and re-assembling a printed circuit board assembly including actuating an actuator of a socket attached to a printed circuit board with the socket securing a first chip to the printed circuit board and the first chip having a first thermal interface pad and a heat sink secured to the chip, removing the first chip and heat sink from the socket, separating the first chip from the heat sink, disposing the first chip and the first thermal interface pad, positioning a second chip on the socket, actuating the actuator to secure the second chip to the printed circuit board, positioning a second thermal interface pad on the top surface of the second chip, positioning the heat sink on the top surface of the second thermal interface pad, and securing the heat sink to the printed circuit board.

Optionally, positioning the second chip on the socket is positioned without fine or all alignment features.

Optionally, at least part of or all of the method is conducted in the field.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
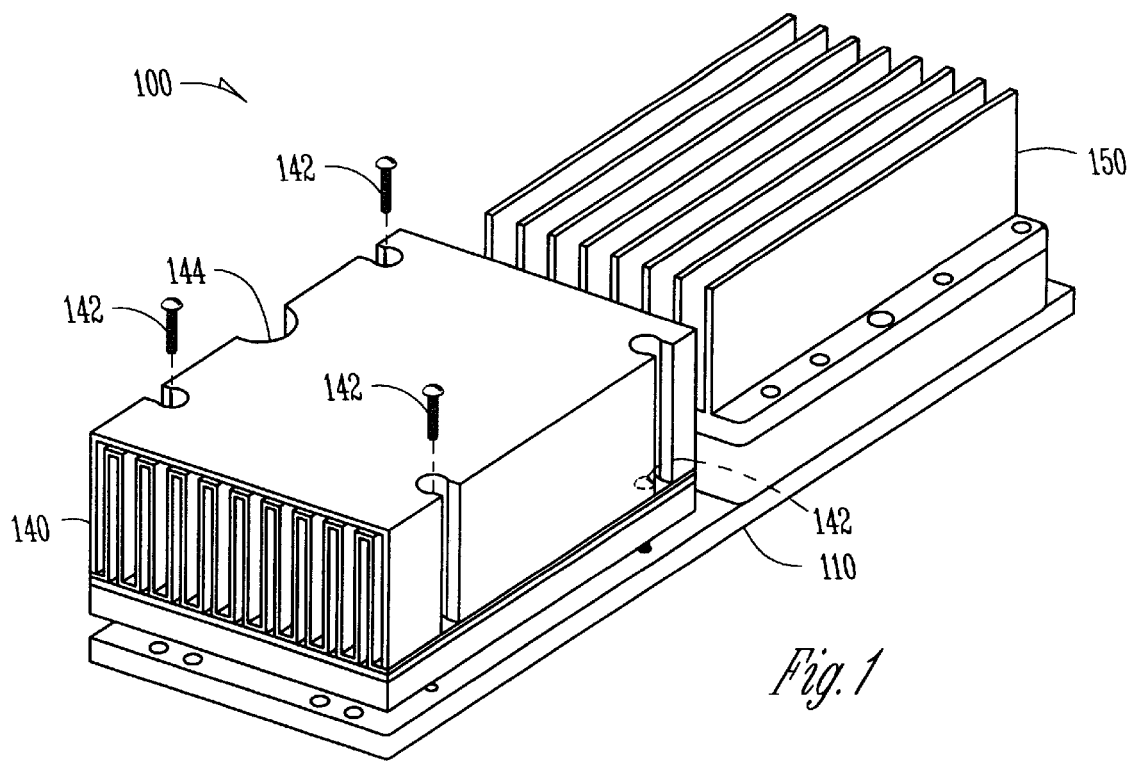
FIG. 1 is a perspective view of a printed circuit board assembly with an embodiment of a heat sink assembly attached to a printed circuit board.

FIG. 1 shows a perspective view of one embodiment of a printed circuit board assembly 100. The assembly 100 includes a printed circuit board 110, a socket 120 (not shown), a microprocessor chip 130(not shown), a thermal interface pad 135 (not shown), and a heat sink 140. Optionally, the printed circuit board assembly includes a power pod 150.

The heat sink 140 is attached to the printed circuit board with captive screws 142 with springs so that a known force is applied to each corner of the heat sink 140. The heat sink has an actuator opening 144 so that the socket actuator for the socket is accessible after the heat sink 140 is positioned on top of the chip.

Figure 2:
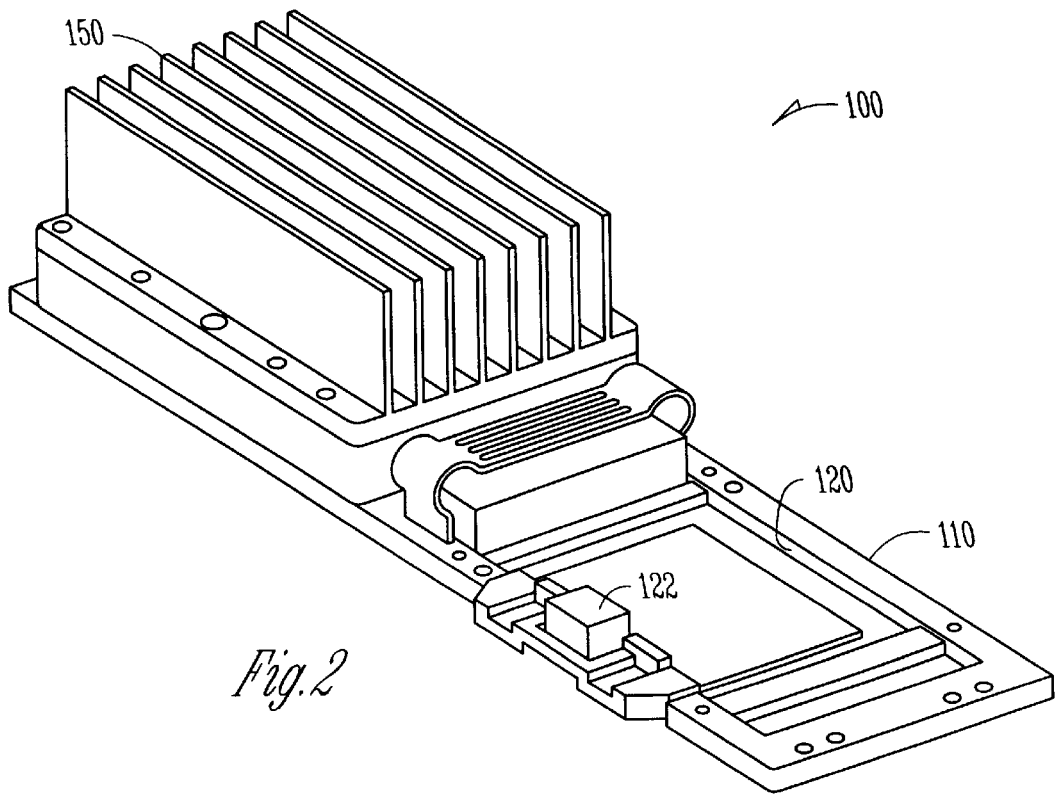
FIG. 2 is perspective view of an embodiment of a heat sink assembly showing the assembly with the heat sink, microprocessor chip, and thermal interface pad removed.

FIG. 2 shows a perspective view of the printed circuit board assembly 100 with the chip and heat sink removed exposing the socket 120. The socket 120 is actuated by the socket actuator 122. The socket 120 and actuator 122 are attached to the circuit board 110.

Figure 3:
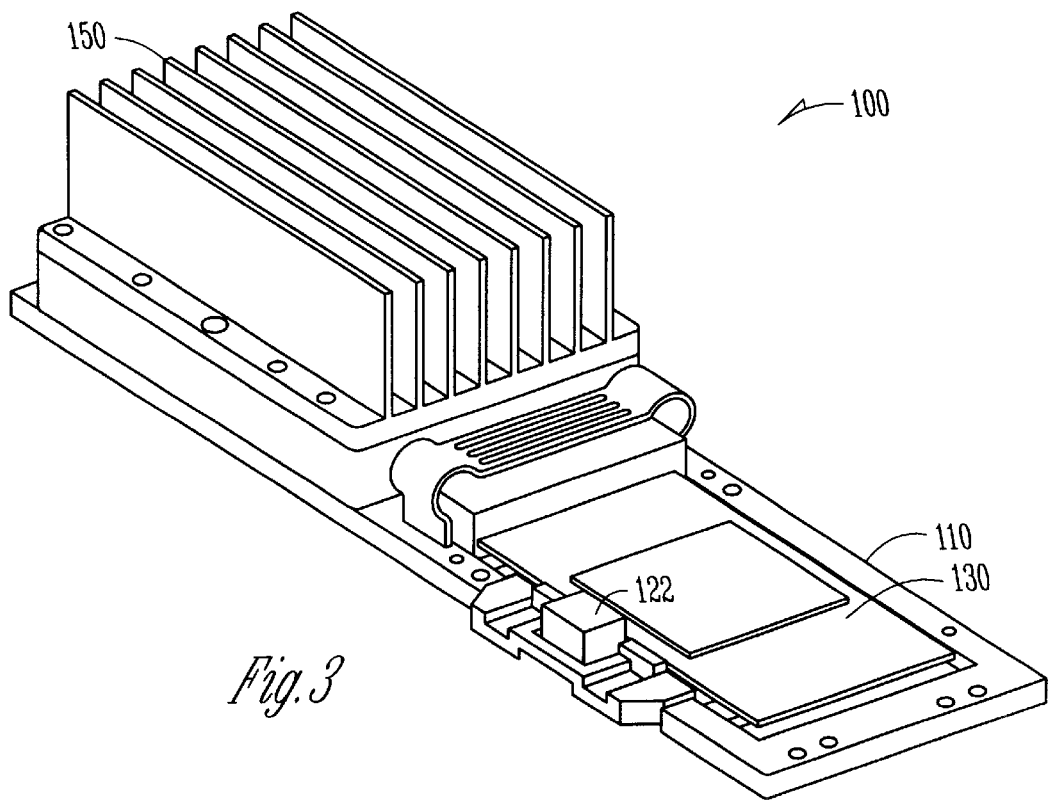
FIG. 3 is a perspective view of one embodiment of the assembly showing the chip without the thermal interface pad and the heat sink attached.

FIG. 3 shows a perspective view of the printed circuit board assembly 100 with the thermal interface pad and heat sink removed. The chip 130 is shown positioned and secured to the socket 120. The chip is a high powered microprocessor such as a 130 watt Intel chip, other high powered Intel microprocessors, or other chips. Since the chip is installed without the heat sink attached, alignment features are not required, but optionally included. The chip 130 may be aligned by hand.

Figure 4:
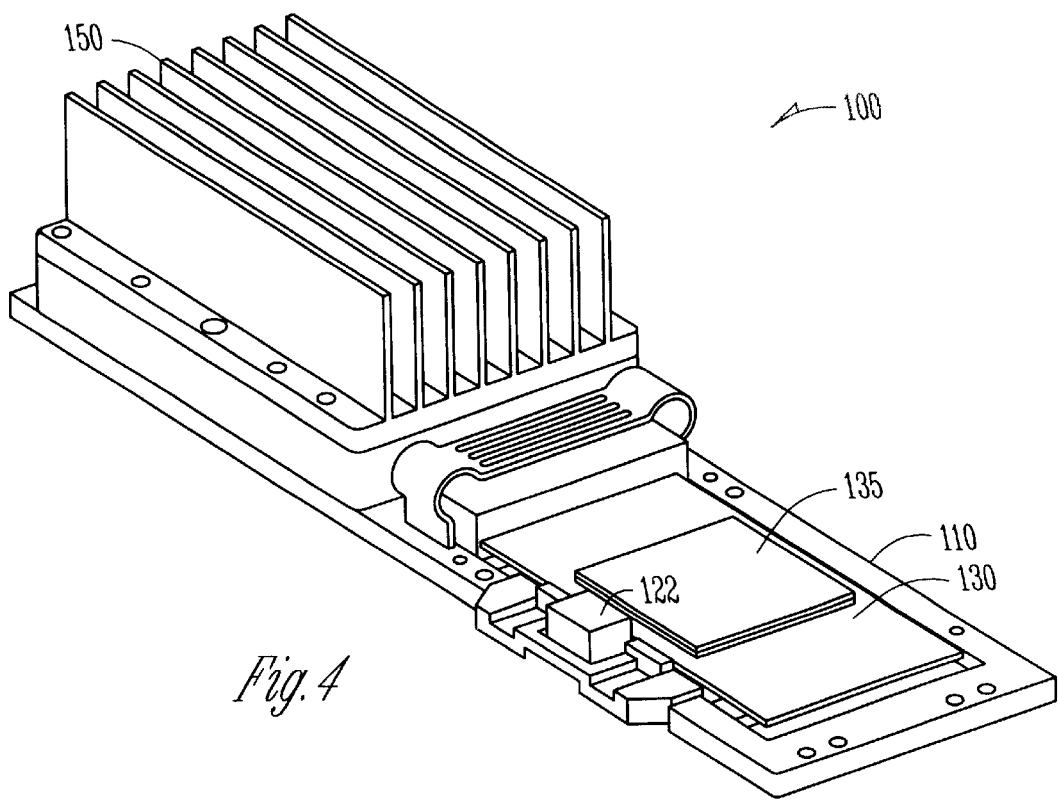
FIG. 4 is a perspective view of one embodiment of the assembly showing the chip and thermal interface pad without the heat sink attached.

FIG. 4 shows a perspective view of the printed circuit board assembly 100 with the heat sink removed. The thermal interface pad 135 is positioned on top of the chip 130. The chip is secured to the socket 120. The thermal interface pad 135 does not require any alignment features to position the thermal interface pad 135 on the chip. Optionally, the thermal interface pad is a phase change material that thermally connects the chip to the heat sink upon heating of the material. A suitable phase change material such as a boron-nitrate filled elastomer is available from Chomerics Division of Parker Hannifin Corporation of Woborn, Mass. as XTS 725 phase change material. Once the phase change material is activated, it bonds to the chip and to the heat sink so that the heat sink and the chip have to be removed from the socket as a unit.

One embodiment of the present invention provides a process of assembly of a chip and heat sink to a circuit board. The chip is positioned on the socket of the circuit board and locked into place. Next, a phase change interface pad is placed on top of the chip or on the bottom of the heat sink. Next, the heat sink is positioned on top of the chip and secured to the circuit board. Since, the chip is already secured to the circuit board, precise alignment features are not needed between the chip and the heat sink or between the heat sink and the circuit board.

Field replacement is simplified as well. The use of a phase change interface pad eliminates the need for thermal grease and allows field assembly of the heat sink to the chip. Since the heat sink and chip do not have to be attached to the circuit board as a unit, alignment features can be simplified. The precise alignment features between the heat sink and the chip are no longer necessary. The precise alignment features between the heat sink and the circuit board are also unnecessary.

One embodiment of the process includes the following process. Place the chip in the socket of the circuit board and actuate the socket. Optionally, alignment features may be used to position the chip in the socket. However, positioning by hand is also an option. If the chip is not attached to a heat sink, alignment of the chip by hand is possible because it is easier to see the pins on the chip and to manipulate the less massive chip without damaging the pins.

Next, apply the phase change thermal interface pad or material to the heat sink. Position the heat sink over the chip and fasten the heat sink to the circuit board. Optionally alignment features may be used to help position the heat sink over the chip. However, precise alignment is not necessary between the chip and the heat sink because the chip, which requires precise alignment, is already secured in the socket and the connection between the chip and the heat sink does not require precise alignment.

A pre-assembled chip/heat sink unit typically relies on the connection of the heat sink to the circuit board to align the unit with the circuit board. Therefore, with a pre-assembled unit, fine alignment features are typically needed between the circuit board and the heat sink as well as between the heat sink and the chip in order to align the pins of the massive heat sink/chip unit in the socket.

Field replacement of the chip is simplified compared to using a thermal grease system. Replacement includes removing the chip and heat sink as a unit. In one embodiment the actuator for the circuit board socket is accessible so that the chip and heat sink are removable as a unit. After removal from the circuit board, the heat sink may be separated from the chip by twisting the heat sink in relation to the chip. Separation by twisting is not typically possible in assembly processes and designs that have alignment features connecting the heat sink and the chip. A replacement chip is positioned in the socket and locked into place with the actuator. A new phase change interface pad is placed on the heat sink or optionally, is placed on the chip, or is placed on the chip before the chip is positioned on the circuit board. Next, the heat sink is positioned on the chip and secured to the circuit board.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of disassembling and re-assembling a printed circuit board assembly comprising:

actuating an actuator of a socket attached to a printed circuit board, the socket securing a first chip, a first thermal interface pad, and a heat sink to the chip;

removing the first chip, the first thermal interface pad, and heat sink from the socket as a unit;

separating the first chip from the heat sink;

disposing the first chip and the first thermal interface pad;

positioning a second chip on the socket;

actuating the actuator to secure the second chip to the printed circuit board;

positioning a second thermal interface pad on the top surface of the second chip;

positioning the heat sink on the top surface of the second thermal interface pad, wherein alignment of the heat sink with respect to the second chip is not necessary; and securing the heat sink to the printed circuit board.

2. The method of claim 1 wherein positioning the second chip on the socket is positioned without fine alignment features.

3. The method of claim 2 wherein the positioning of the second chip comprises positioning the second chip without alignment features.

4. The method of claim 1 wherein separating the first chip from the heat sink comprises separating by twisting the heat sink in relation to the first chip.

5. The method of claim 1 wherein at least part of the method is conducted in the field.

6. The method of claim 1 wherein all of the method is conducted in the field.

* * * * *